United States Patent
Cheng

(10) Patent No.: US 7,279,789 B2
(45) Date of Patent: Oct. 9, 2007

(54) THERMALLY ENHANCED THREE-DIMENSIONAL PACKAGE AND METHOD FOR MANUFACTURING THE SAME

(75) Inventor: Ming-Hsiang Cheng, Kao-Hsiung (TW)

(73) Assignee: Advanced Semiconductor Engineering, Inc., Kao-Hsiung (TW)

( * ) Notice: Subject to any disclaimer, the term of this patent is extended or adjusted under 35 U.S.C. 154(b) by 85 days.

(21) Appl. No.: 11/164,819

(22) Filed: Dec. 7, 2005

(65) Prior Publication Data

US 2006/0220224 A1    Oct. 5, 2006

(30) Foreign Application Priority Data

Mar. 29, 2005    (TW) ............................... 94109880 A

(51) Int. Cl.
*H01L 23/02*    (2006.01)
*H01L 23/34*    (2006.01)

(52) U.S. Cl. .................. 257/713; 257/712; 257/686

(58) Field of Classification Search ............... 257/686, 257/712, 713, 706, 717, E23.101, E23.123, 257/E23.194
See application file for complete search history.

(56) References Cited

U.S. PATENT DOCUMENTS

| | | | |
|---|---|---|---|
| 5,222,014 A | | 6/1993 | Lin |
| 5,949,137 A | * | 9/1999 | Domadia et al. ............ 257/712 |
| 6,472,741 B1 | * | 10/2002 | Chen et al. .................. 257/712 |
| 2004/0080036 A1 | * | 4/2004 | Chang et al. ................ 257/686 |
| 2006/0060963 A1 | * | 3/2006 | Chang ......................... 257/706 |

* cited by examiner

*Primary Examiner*—Theresa Doan
*Assistant Examiner*—Sarah K Harding
(74) *Attorney, Agent, or Firm*—Winston Hsu

(57) ABSTRACT

A thermally enhanced three-dimensional (3D) package is disclosed. The package includes a heat sink having an opening and a stiffener ring inside the opening. The stiffener ring has a first surface and a second surface. A first substrate of a first package is disposed inside the opening and secured to the first surface of the stiffener ring. A second substrate of a second chip package is secured to the second surface of the stiffener ring. The first substrate is connected to the second substrate through a plurality of solder balls. The heat generated in the first chip package and the second chip package is dissipated by the heat sink. The first chip package and the second chip package are fixed by the stiffener ring to eliminate warpage of the first chip package and the second chip package, thereby assuring the electrical transmission of the product.

6 Claims, 9 Drawing Sheets

THERMALLY ENHANCED THREE-DIMENSIONAL PACKAGE AND METHOD FOR MANUFACTURING THE SAME

BACKGROUND OF THE INVENTION

1. Field of the Invention

The invention relates to a thermally enhanced three-dimensional package, and more particularly, to a three dimensional package utilizing a heat sink on a first chip package to position another chip package.

2. Description of the Prior Art

In conventional semiconductor packages, three dimensional packages fabricated by stacking a plurality of chip packages over one another are commonly utilized to achieve multi-functional purpose. However, as the chip packages generate large amounts of heat during operation, a heat sink is often installed to maintain the three dimensional package at a normal working temperature. Additionally, a boat is utilized to position the chip packages while stacking the chip packages over one another. This will unavoidably increase the overall cost. Moreover, a slight miscalculation in the size of the boat or the edge of the substrate of the chip packages will result in a cold joint issue and unsuccessful bonding of the chip package, and as the chip packages undergo numerous reflow processes, a warpage phenomenon will often result.

Please refer to FIG. 1. FIG. 1 is a perspective diagram showing a cross-section of a conventional three-dimensional package. As shown in FIG. 1, the three-dimensional package 100 includes a first chip package 110, a second chip package 120, a plurality of solder balls 130, and a plurality of external conductive devices 140. Preferably, the first chip package 110 includes a first substrate 111 and a first flip chip 112, in which the first substrate 111 includes a top surface 113 and a bottom surface 114. The flip chip 112 is connected to the bottom surface 114 of the first substrate 111 by utilizing a plurality of bumps 115, in which the bumps 115 are sealed by an underfill layer 116. Similarly, the second chip package 120 includes a second substrate 121 and a second flip chip 122, in which the second substrate 121 includes a top surface 123 and a bottom surface 124. The second flip chip 122 is connected to the top surface 123 of the second substrate 121 by utilizing a plurality of bumps 125, in which the bumps 125 are sealed by an underfill layer 126. Additionally, the solder balls 130 are formed between the top surface 113 of the first substrate 111 and the bottom surface 124 of the second substrate 121 to electrically connect the first chip package 110 and the second chip package 120, and the external conductive devices 140 are disposed on the bottom surface 114 of the first substrate 111 for connecting to other electronic devices (not shown).

Essentially, the first chip package 110 and the second chip package 120 of the three-dimensional package 100 often generate significant amounts of heat during operation thereto reducing the performance of the device as a result of overheating. Additionally, phenomenon such as warpage occurs frequently on the first chip package 110 and the second chip package 120 and influences the structural sturdiness and electrical transmission of the three-dimensional package 100. Furthermore, when the first chip package 110 and the second chip package 120 are stacked over each other, a boat is commonly utilized to position the first chip package 110 and the second chip package 120, thereby increasing cost and reducing over yield.

SUMMARY OF THE INVENTION

It is therefore an objective of the present invention to provided a thermally enhanced three-dimensional package. Preferably, the thermally enhanced three-dimensional package includes a heat sink, a first chip package, and a second chip package, in which the heat sink includes an opening and a stiffener ring inside the opening. A first substrate of the first chip package is positioned in the opening and secured on a first surface of the stiffener ring, and a second substrate of the second chip package is secured on a second surface of the stiffener ring. By utilizing the stiffener ring to secure the first chip package and the second chip package, the present invention is able to prevent the warpage phenomenon of the first chip package and the second chip package.

It is another aspect of the present invention to provide a thermally enhanced three-dimensional package. Preferably, the thermally enhanced three-dimensional package includes a heat sink having an opening and a stiffener ring inside the opening, a first chip package disposed on a first surface of the stiffener ring, and a second chip package disposed on a second surface of the stiffener ring, such that the heat generated by the first chip package and the second chip package during operation can be dissipated via the heat sink.

It is another aspect of the present invention to provide a thermally enhanced three-dimensional package. Preferably, the thermally enhanced three-dimensional package includes a heat sink having an opening and a stiffener ring inside the opening, a first chip package disposed on a first surface of the stiffener ring, and a second chip package disposed on a second surface of the stiffener ring, in which the stiffener ring is utilized to control the height of the solder balls between the first chip package and the second chip package, thereby preventing a solder failure or a broken circuit.

It is another aspect of the present invention to provide a method of fabricating a thermally enhanced three dimensional package, the method includes: providing a first chip package, wherein the first chip package comprises a first substrate; disposing a heat sink having a first opening and a stiffener ring inside the first opening on the first chip package, wherein the stiffener ring comprises a first surface and a second surface and the first substrate of the first chip package is disposed in the opening of the heat sink and secured to the first surface of the stiffener ring; disposing a second chip package having a second substrate on the heat sink, wherein the second substrate is secured to the second surface of the stiffener ring; and performing a reflow process for forming a plurality of solder balls between the first substrate and the second substrate, wherein the solder balls are formed inside the stiffener ring for connecting the first substrate and the second substrate.

According to the present invention, a thermally enhanced three dimensional package includes: a heat sink having a first opening and a stiffener ring inside the opening, in which the stiffener ring comprises a first surface and a second surface; a first chip package having a first substrate, in which the first substrate is disposed in the opening of the heat sink and secured to the first surface of the stiffener ring; a second chip package having a second substrate, in which the second substrate is secured to the second surface of the stiffener ring; and a plurality of solder balls disposed between the first substrate of the first chip package and the second substrate of the second chip package and inside the stiffener ring for connecting the first substrate and the second substrate. Preferably, the heat sink is utilized to position and facilitate the stacking of the first chip package and the second chip package, and the stiffener ring is utilized to secure the first chip package and the second chip package for preventing a warpage phenomenon and facilitating the heat dissipation of the two package structures.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
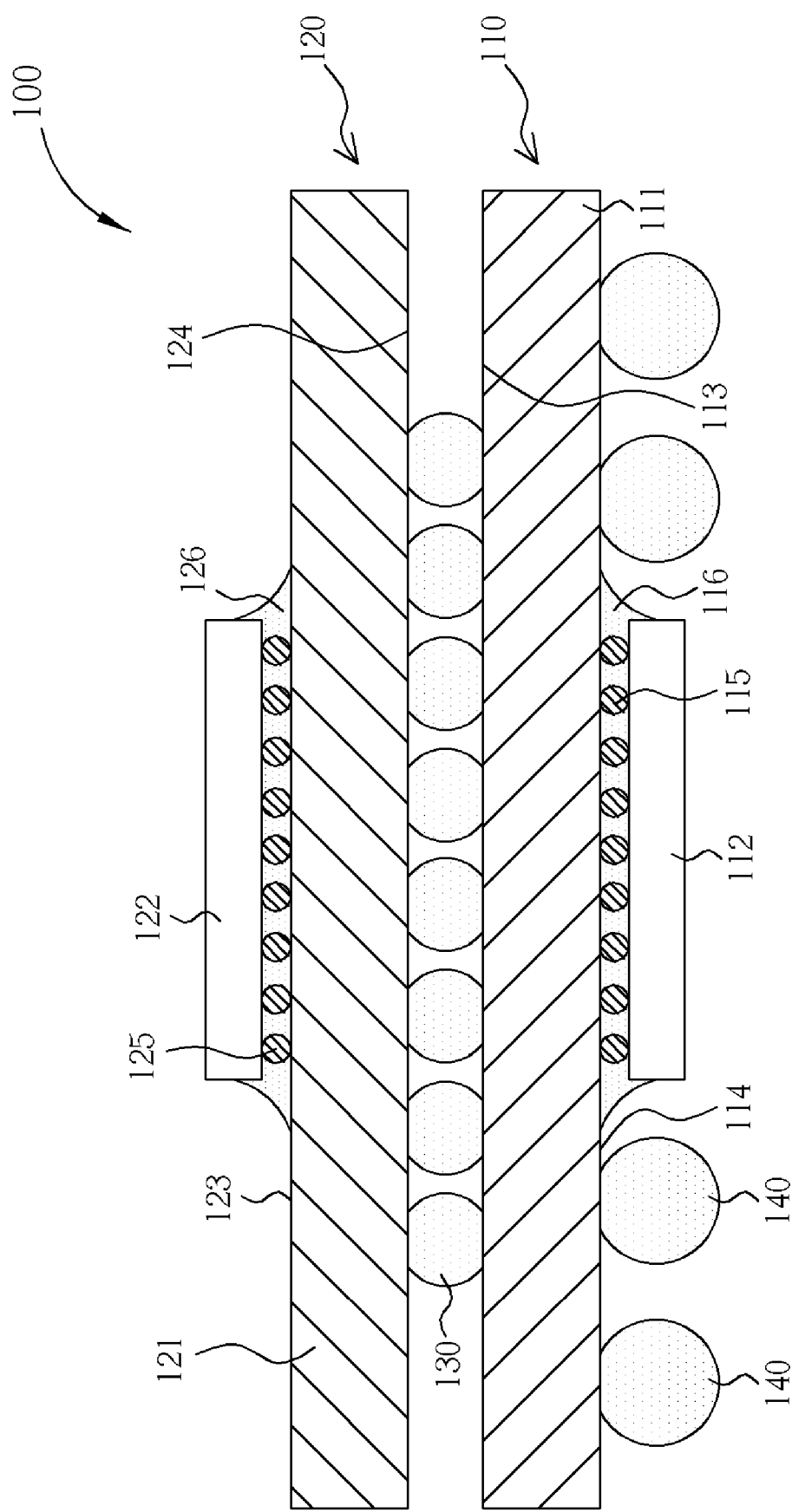
FIG. 1 is a perspective diagram showing a cross-section of a conventional three-dimensional package.
Figure 2:
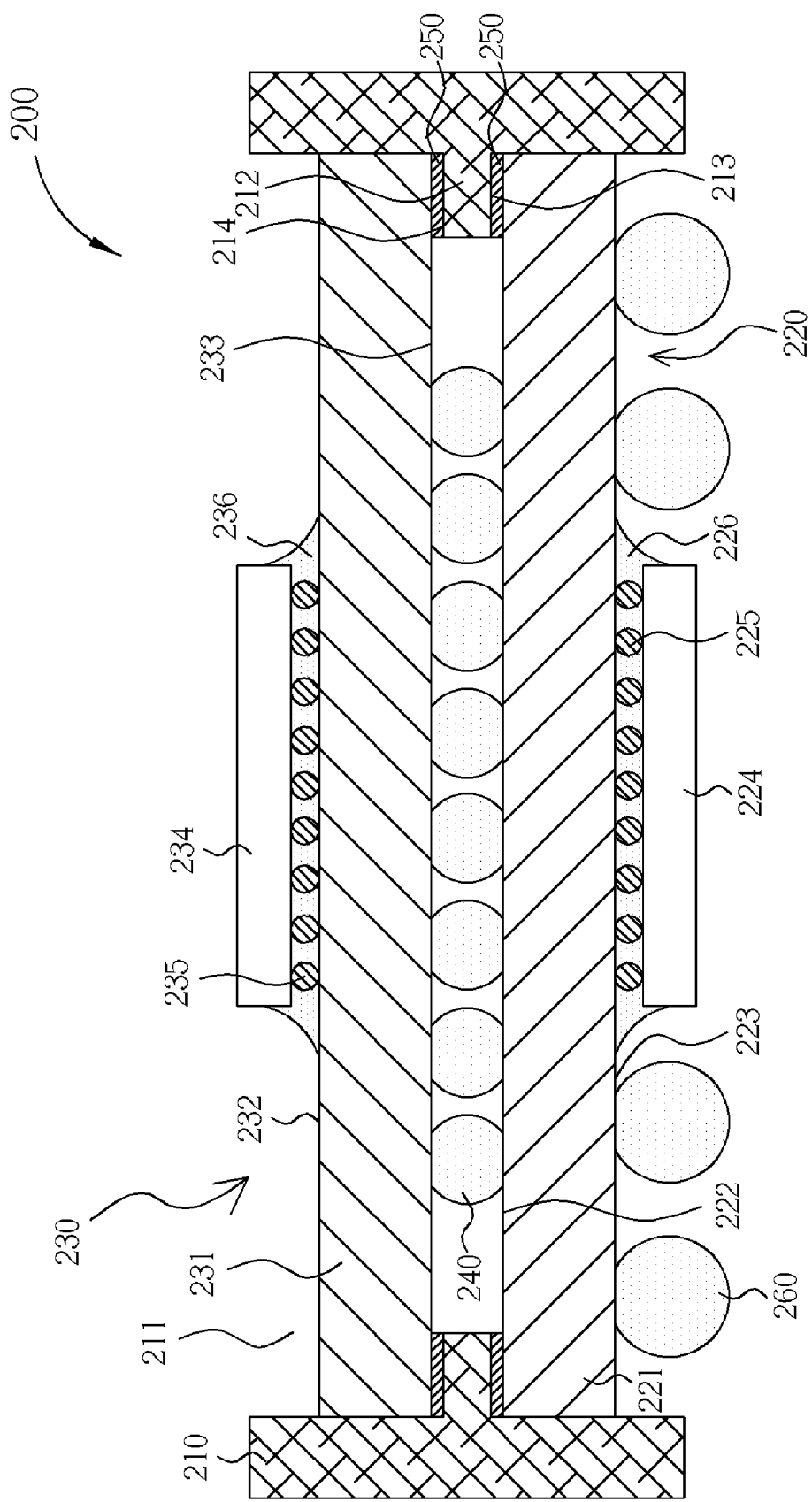
FIG. 2 is a perspective diagram showing the cross-section of a thermally enhanced three-dimensional package according to the first embodiment of the present invention.
Figure 3:
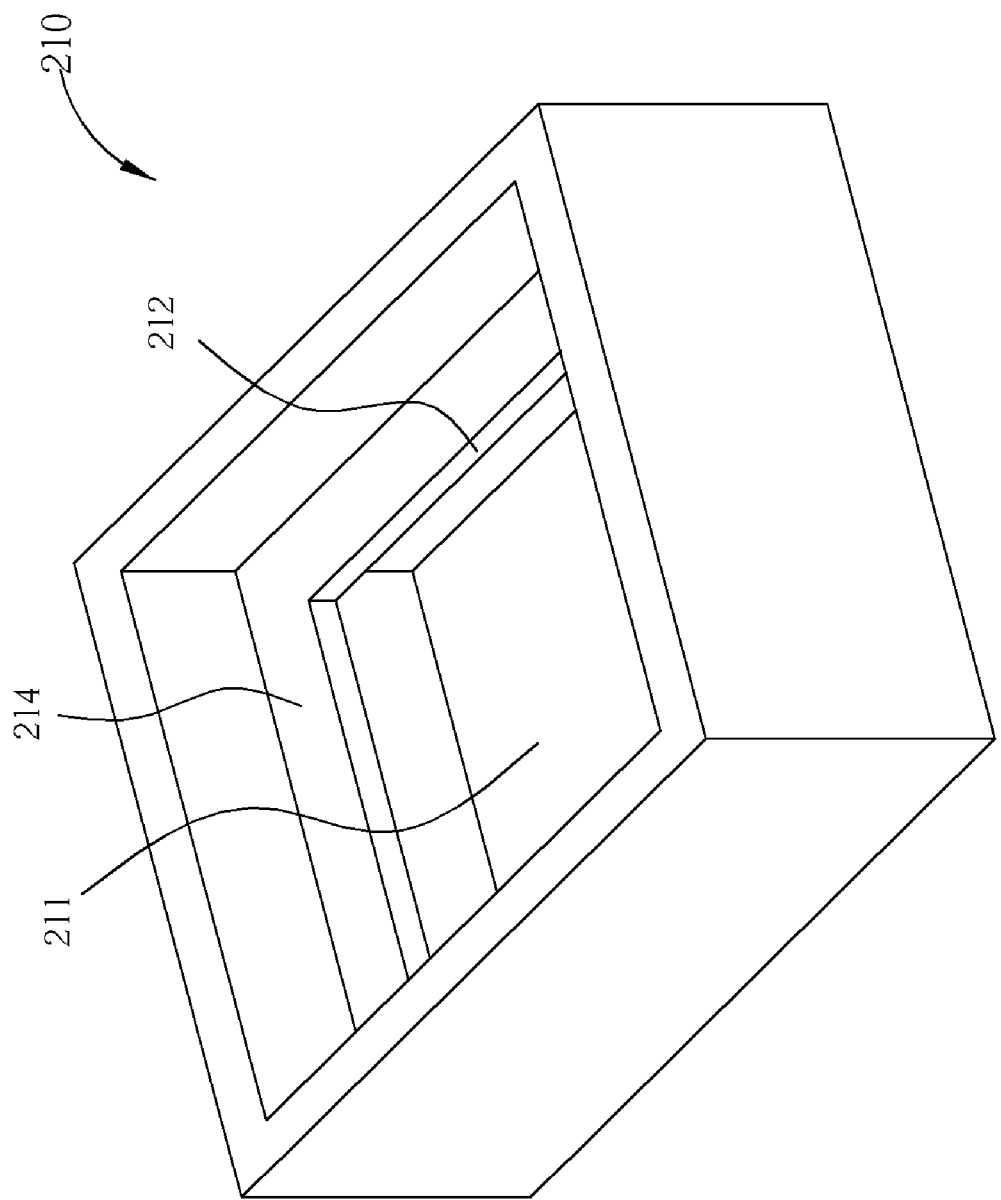
FIG. 3 is a three-dimensional diagram showing the heat sink of FIG. 2.

Please refer to FIG. 2 and FIG. 3. FIG. 2 is a perspective diagram showing the cross-section of a thermally enhanced three-dimensional package according to the first embodiment of the present invention and FIG. 3 is a three-dimensional diagram showing the heat sink from FIG. 2. As shown in FIG. 2 and FIG. 3, a thermally enhanced three-dimensional package 200 includes a heat sink 210, a first chip package 220, a second chip package 230, and a plurality of solder balls 240. Preferably, the heat sink 210 includes an I-shaped cross-section, an opening 211, and a stiffener ring 212 inside the opening 211, in which the stiffener ring 212 is monolithically formed on the heat sink 210. Additionally, the stiffener ring 212 includes a first surface 213 and a second surface 214, such that the opening 211 exposes the first surface 213 and the second surface 214. The first chip package 220 includes a first substrate 221 having a top surface 222 and a bottom surface 223, in which the first substrate 221 is disposed in the opening 211 of the heat sink 210 and secured to the first surface 213 of the stiffener ring 212 by utilizing an adhesive 250, thereby preventing the first substrate 221 of the first chip package 220 from suffering from the warpage phenomenon. The first chip package 220 also includes a first chip 224 and a plurality of bumps 225. According to the present embodiment, the first chip 224 is connected to the bottom surface 223 of the first substrate 221 by a flip chip packaging process, the bumps 225 are electrically connected to the bottom surface 223 of the first substrate 221, and an underfill layer 226 is formed to seal the bumps 225. Additionally, the thermally enhanced three-dimensional package 230 includes a plurality of external conductive devices 260, such as solder balls or pins, in which the external conductive devices 260 are disposed on the bottom surface 223 of the first substrate 221 and exposed from the opening 211 of the heat sink 210 to provide an external connection to other electronic devices (not shown).

The second chip package 230 includes a second substrate 231 having a top surface 232 and a bottom surface 233. Preferably, the second substrate 231 is disposed on the second surface 214 of the stiffener ring 212, in which the second substrate 231 is secured to the second surface 214 by another adhesive 250 for preventing warpage of the second substrate 231. The second chip package 230 also includes a second chip 234, such as a flip chip and a plurality of bumps 235, in which the second chip 234 is electrically connected to the top surface 232 of the second substrate 231 by utilizing the bumps 235, and an underfill layer 236 is formed to seal the bumps 235 thereafter.

The solder balls 240 are formed between the first substrate 221 of the first chip package 220 and the second substrate 231 of the second chip package 230 and inside the stiffener ring 212 of the heat sink 210, such that the solder balls 240 are utilized to connect the first substrate 221 and the second substrate 231, and facilitate the stacking of the first chip package 220 and the second chip package 230. Preferably, the height of the solder balls 240 can be adjusted via the stiffener ring 212, thereby preventing a solder failure or a broken circuit.

By utilizing the heat sink 210 to position the first chip package 220 and the second chip package 230, the present invention requires no additional boat as in the prior art. Additionally, the first chip package 220 and the second chip package 230 are secured on the stiffener ring 212 to prevent the warpage phenomenon. Furthermore, the heat generated by the first chip package 220 and the second chip package 230 during operation can be transmitted via the first substrate 221 of the first chip package 220, the second substrate 231 of the second chip package 230, and the stiffener ring 212 to the heat sink 210, such that the heat will be dissipated by the heat sink 210.

Figure 4:
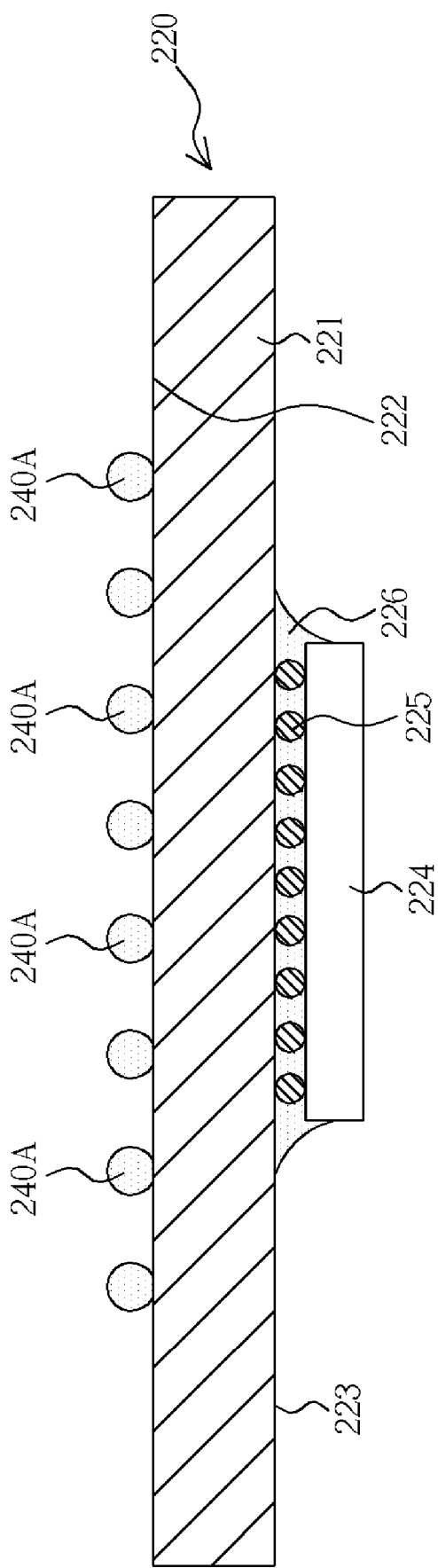
FIG. 4 through FIG. 6 are perspective diagrams showing a means of fabricating the thermally enhanced three-dimensional package 200 according to the first embodiment of the present invention.
Figure 5:
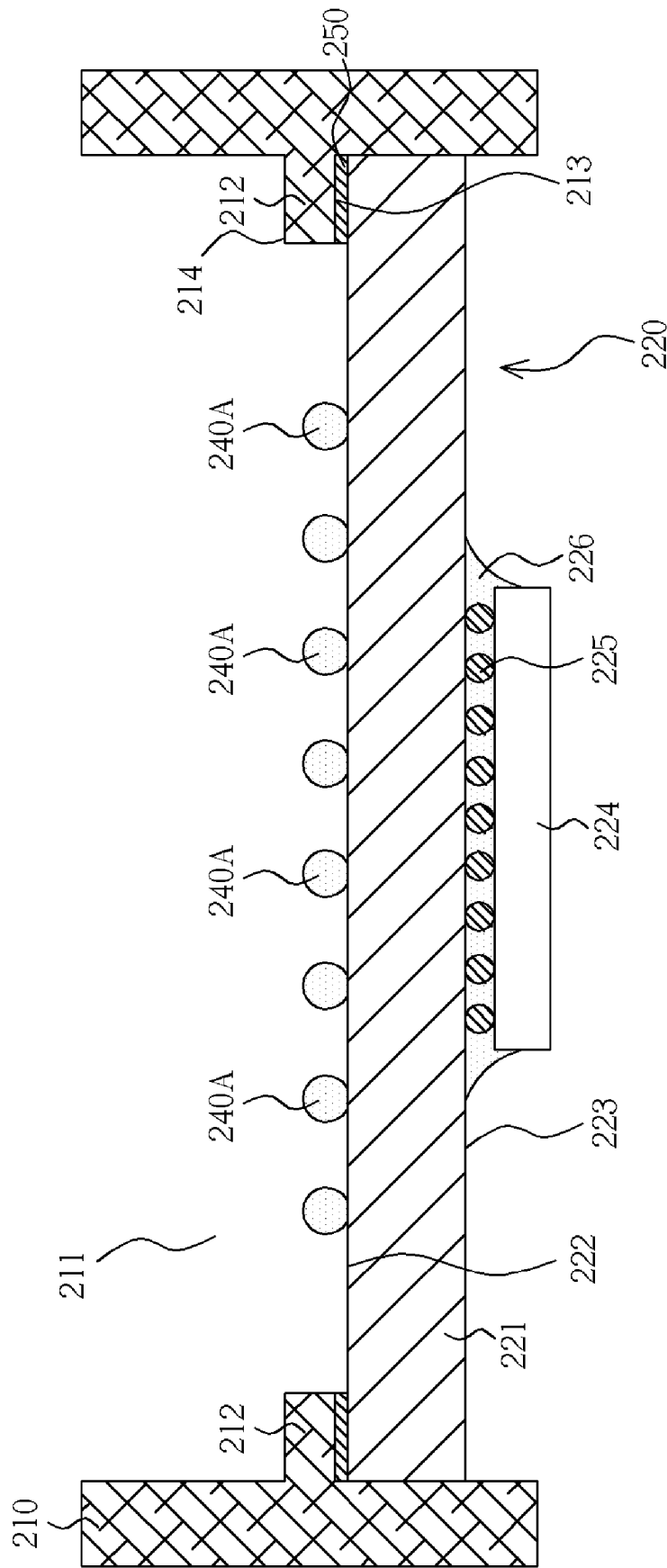
Figure 6:
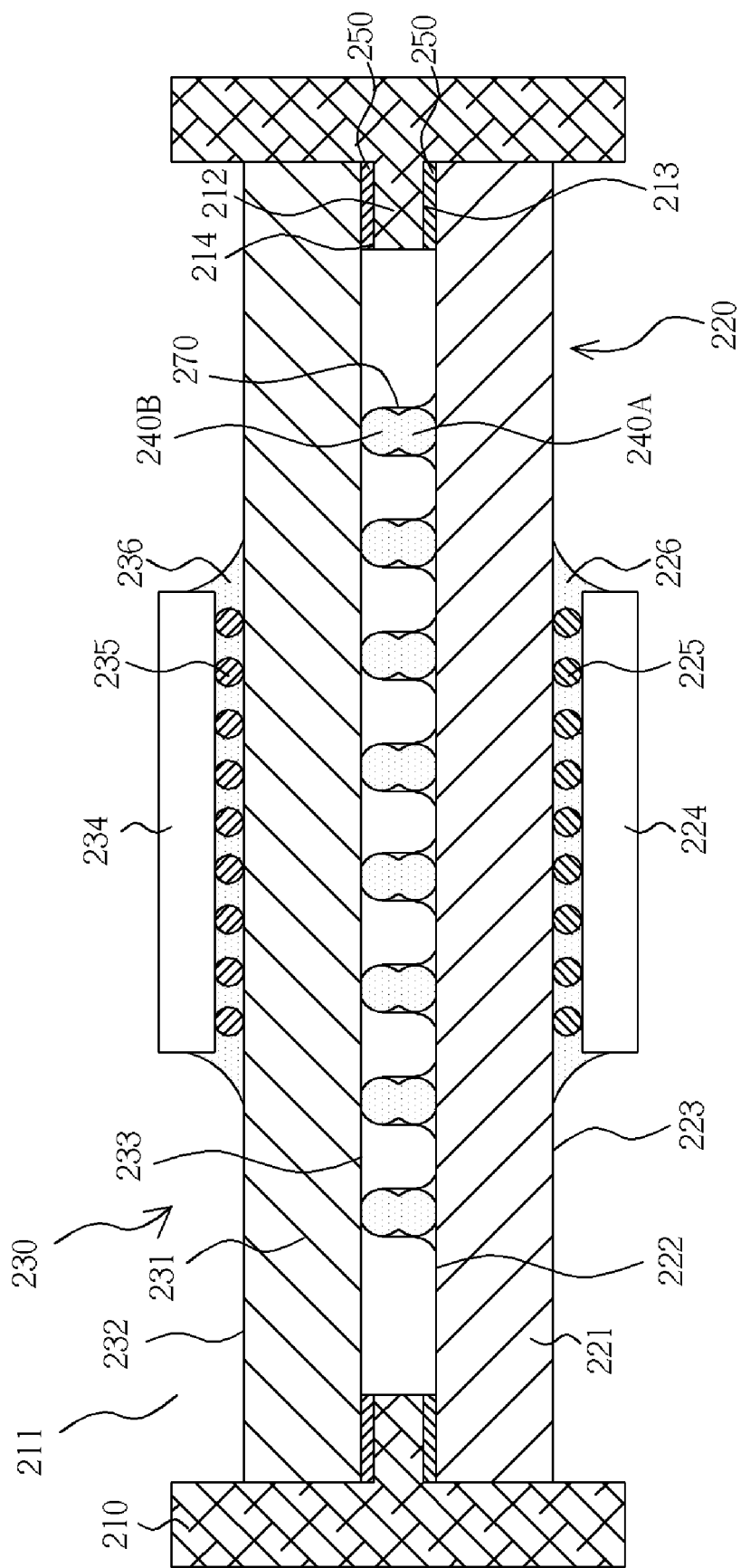

Please refer to FIG. 4 through FIG. 6. FIG. 4 through FIG. 6 are perspective diagrams showing a means of fabricating the thermally enhanced three-dimensional package 200 according to the first embodiment of the present invention. As shown in FIG. 4, a first chip package 220 having a first substrate 221 and a first chip 224 is first provided. Preferably, the first substrate 221 includes a top surface 222 and a bottom surface 223, in which the first chip 224 is attached to the bottom surface 223 of the first substrate 221 by utilizing a plurality of bumps 225. Next, a plurality of solder bumps 240a is formed on the top surface 222 of the first substrate 221.

As shown in FIG. 5, a heat sink 210, such as the one shown in FIG. 3, is disposed on the top surface 222 of the first chip package 220. Preferably, the heat sink 210 includes an opening 211 and a stiffener ring 212 inside the opening 211, in which the stiffener ring 212 includes a first surface 213 and a second surface 214. Subsequently, an adhesive 250 is applied on the stiffener ring 212 for attaching the first substrate 221 on the first surface 213 of the stiffener ring 212.

As shown in FIG. 6, a second chip package 230 having a second substrate 231 and a second chip 234 is disposed on the stiffener ring 212 of the heat sink 210. Preferably, the second chip package 230 includes a second substrate 231 and a second chip 234, in which the second chip 234 is connected to the top surface 232 of the second substrate 231 by utilizing the plurality of bumps 235. Additionally, an adhesive 250 is formed to attach the second chip package 230 on the second surface 214 of the stiffener ring 212, and a plurality of second solder bumps 240b is formed on the bottom surface 233 of the second substrate 231. Preferably, the heat sink 210 is utilized to position the first chip package 220 and the second chip package 230, such that the second solder bumps 240b of the second chip package 230 can be aligned corresponding to the first solder bumps 240a of the first chip package 220. Subsequently, a soldering flux 270 is formed on the first solder bumps 240a or the second solder bumps 240b to facilitate the melting of the first solder bumps 240a and the second solder bumps 240b during a reflow process for producing a plurality of solder balls 240 (as shown in FIG. 2). Preferably, the height of the stiffener ring 212 of the heat sink 210 is controlled corresponding to the height of the solder balls 240 between the first chip package 220 and the second chip package 230 to prevent a solder failure or a broken circuit. Subsequently, a plurality of external conducting devices 260 is disposed on the bottom surface 223 of the first substrate 221 and exposed from the opening 211 of the heat sink 210 for forming a thermally enhanced three-dimensional package 200 (as shown in FIG. 2).

Figure 7:
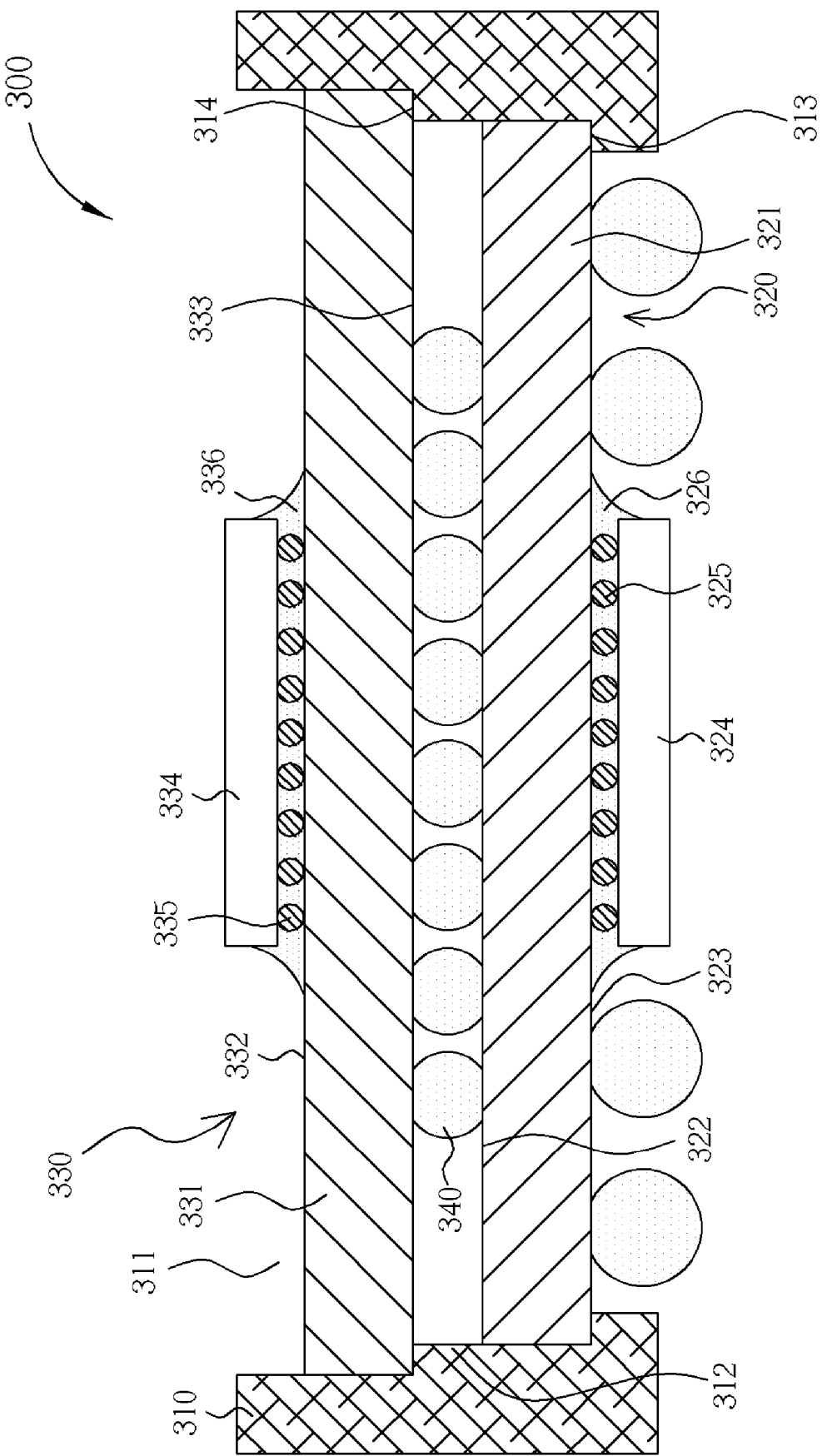
FIG. 7 is a perspective diagram showing the cross-section of a thermally enhanced three-dimensional package according to the second embodiment of the present invention.

Please refer to FIG. 7. FIG. 7 is a perspective diagram showing the cross-section of a thermally enhanced three-dimensional package 300 according to the second embodiment of the present invention. As shown in FIG. 7, the thermally enhanced three-dimensional package 300 includes a heat sink 310, a first chip package 320, a second chip package 330, and a plurality of solder balls 340, in which the heat sink 310 includes an opening 311 and a stiffener ring 312 inside the opening 311. According to the present embodiment, the stiffener ring 312 is step-shaped, in which the stiffener ring 312 also includes a first surface 313 and a second surface 314, and both the first surface 313 and the second surface 314 expose the opening 311. Preferably, the first chip package 320 is disposed in the opening 311, in which the first chip package 320 includes a first substrate 321 and a first chip 324. Additionally, the first substrate includes a top surface 322 and a bottom surface 323, in which the first substrate 321 is positioned in the opening 311 of the heat sink 310 and secured on the first surface 313 of the stiffener ring 310. The first chip 322 is connected to the bottom surface 323 of the first substrate 321 by utilizing a plurality of bumps 325, and an underfill layer 326 is formed to seal the bumps 325.

The second chip package 330 includes a second substrate 331 and a second chip 334. Preferably, the second substrate 331 includes a top surface 332 and a bottom surface 333, in which the second substrate 331 is disposed in the opening 311 of the heat sink 310 and secured on the second surface 314 of the stiffener ring 312. The second chip 334 is attached to the top surface 332 of the second substrate 314 by utilizing a plurality of bumps 335, and an underfill layer 336 is formed to seal the bumps 335. The solder balls 340 are disposed between the top surface 322 of the first substrate 321 and the bottom surface 333 of the second substrate 331, the first chip package 320 is secured on the first surface 313 of the stiffener ring 312, and the second chip package 330 is secured on the second surface 314 of the stiffener ring 312 to facilitate the alignment of the first chip package 320 and the second chip package 330 while stacking the packages over each other. Preferably, the present invention is able to utilize the stiffener ring 313 to secure the first chip package 320 and the second chip package 330 to prevent warpage of the two packages, utilize the heat sink 310 of the stiffener ring 312 to dissipate heat, and utilize the step-shaped stiffener ring 312 to control the height of the solder balls 340 between the first chip package 320 and the second chip package 330 for preventing a solder failure or a broken circuit.

Figure 8:
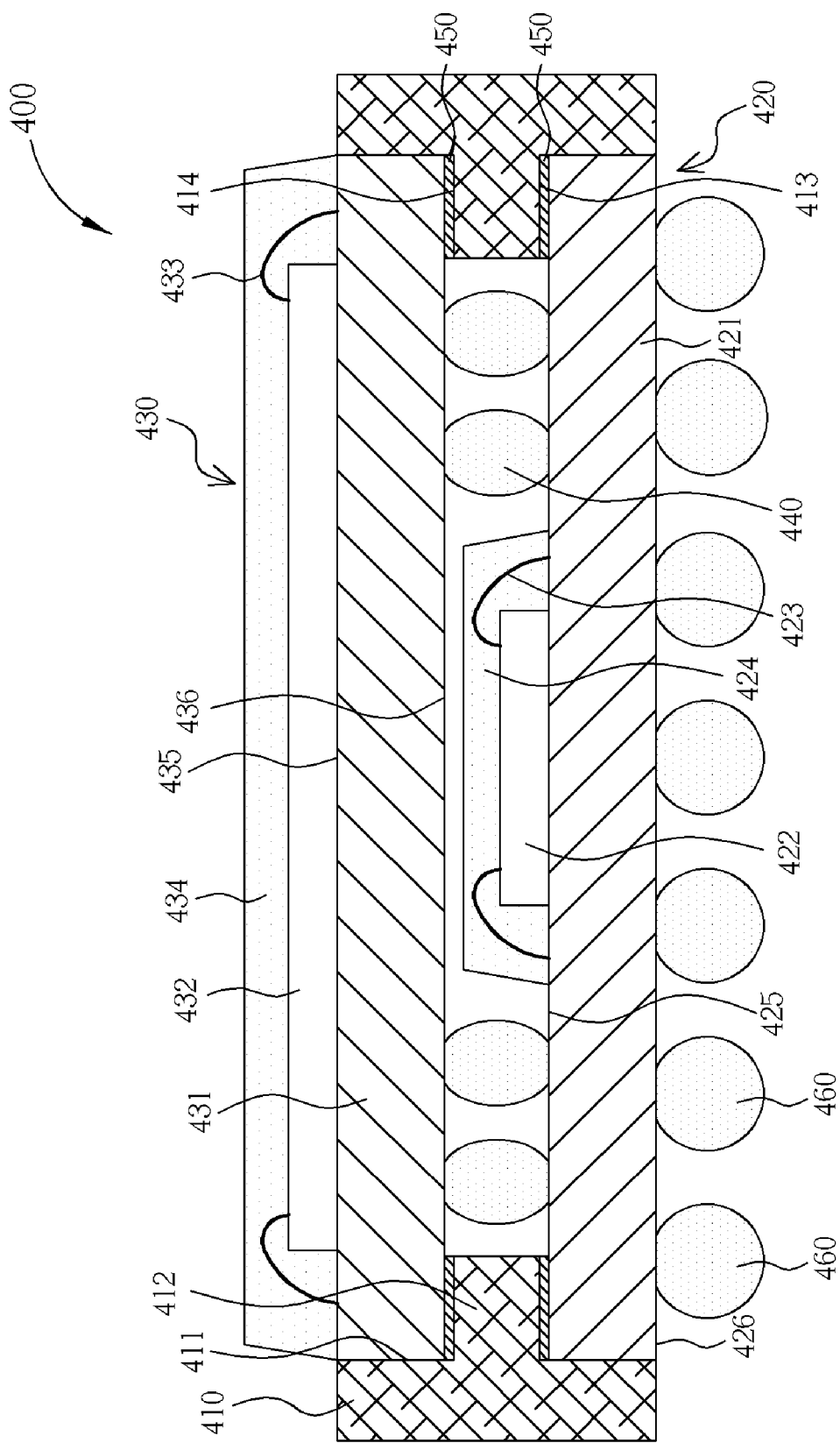
FIG. 8 is a perspective diagram showing the cross-section of a thermally enhanced three-dimensional package according to the third embodiment of the present invention.

Please refer to FIG. 8. FIG. 8 is a perspective diagram showing the cross-section of a thermally enhanced three-dimensional package 400 according to the third embodiment of the present invention. As shown in FIG. 8, the thermally enhanced three-dimensional package 400 includes a heat sink 410, a first chip package 420, a second chip package 430, and a plurality of solder balls 440. Preferably, the heat sink 410 includes an opening 411 and a stiffener ring 412 inside the opening 411, in which the stiffener ring 412 includes a first surface 413 and a second surface 414, such that the first surface 413 and the second surface 414 expose the opening 411.

The first chip package 420 includes a first substrate 421, a first chip 422, a plurality of wires 423, and a sealing compound 424, in which the first substrate 421 includes a top surface 425 and a bottom surface 426. The first chip 422 is disposed on the top surface 425, in which the first chip 422 is electrically connected to the first substrate 421 via the wires 423, and the sealing compound 424 is utilized to seal the first chip 422 and the wires 425. Preferably, the first substrate 421 is contained in the opening 411 of the heat sink 410 and secured to the first surface 413 of the stiffener ring 412, in which an adhesive 450 is disposed to secure the bonding of the stiffener ring 412 and the first substrate 421 and prevent warpage of the first substrate 421. Additionally, the thermally enhanced three-dimensional package 400 includes a plurality of external conductive devices 460, such as solder balls. As shown in FIG. 8, the external conductive devices 460 are disposed on the bottom surface 426 of the first substrate 421 and exposed from the opening 411 of the heat sink 410.

The second chip package 430 includes a second substrate 431, a second chip 432, a plurality of wires 433, and a sealing compound 434, in which the second substrate 431 includes a top surface 435 and a bottom surface 436. The second chip 432 is disposed on the top surface 435 of the second substrate 431 and electrically connected to the second substrate 431 via the wires 433, and the sealing compound 434 is formed on the top surface 435 of the second substrate 431 to seal and protect the second chip 432 and the wires 433. The second substrate 431 is secured on the surface 414 of the stiffener ring 412, in which an adhesive 450 is disposed on the second surface 414 of the stiffener ring 412 to prevent the second substrate 431 of the second chip package 430 from suffering from the warpage phenomenon.

The solder balls 440 are formed between the top surface 425 of the first substrate 421 and the bottom surface 436 of the second substrate 431 and on the periphery of the first chip 422, in which the solder balls 440 are utilized to electrically connect the first substrate 421 and the second substrate 431. Preferably, the thermally enhanced three-dimensional package 400 is able to utilize the stiffener ring 412 to control the height of the solder balls 440 to prevent a solder failure or a broken circuit, and utilize the heat sink 410 to dissipate the heat generated during the operation of the first chip package 420 and the second chip package 430.

Figure 9:
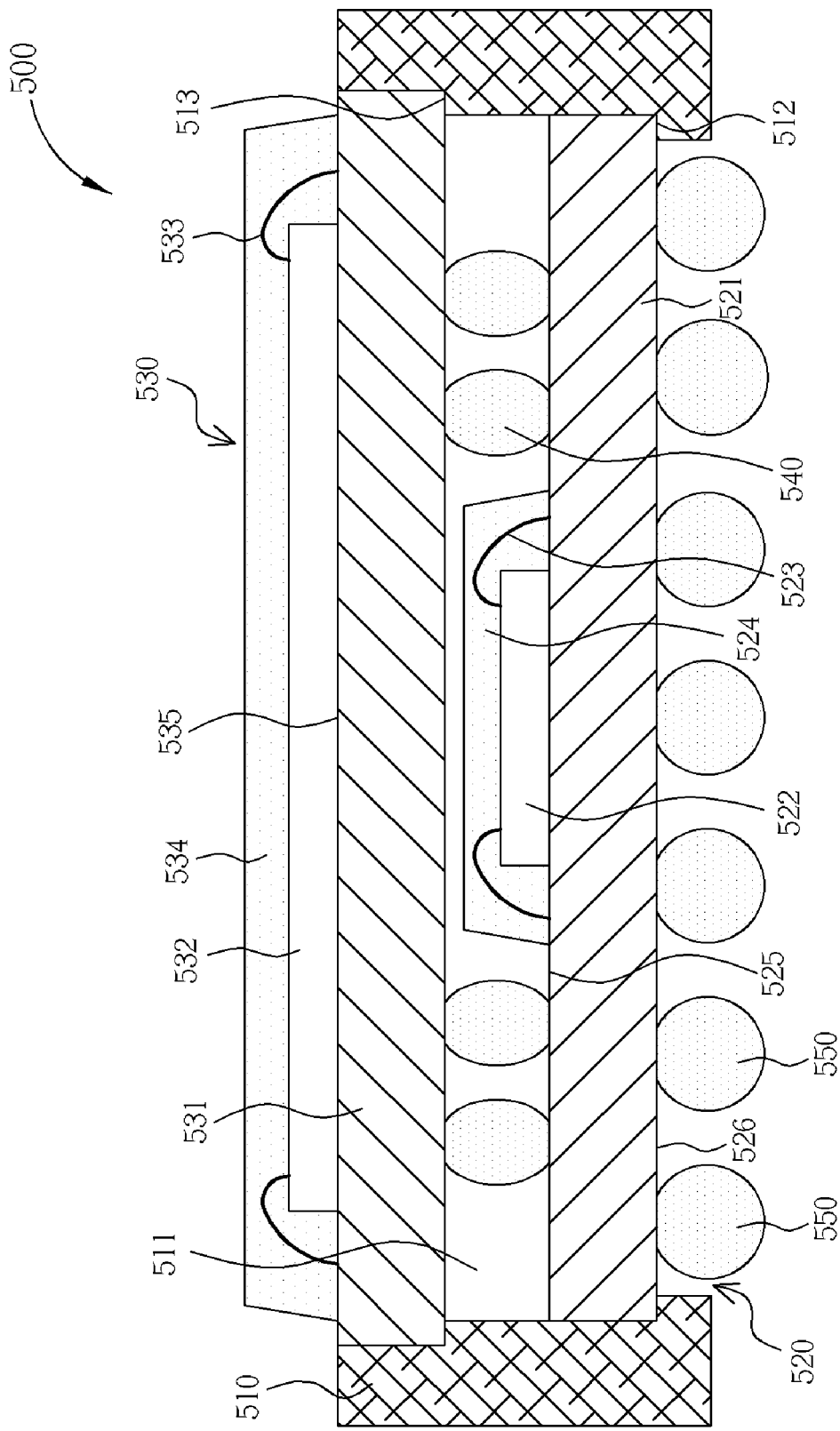
FIG. 9 is a perspective diagram showing the cross-section of a thermally enhanced three-dimensional package according to the fourth embodiment of the present invention.

Please refer to FIG. 9. FIG. 9 is a perspective diagram showing the cross-section of a thermally enhanced three-dimensional package 500 according to the fourth embodiment of the present invention. As shown in FIG. 9, the thermally enhanced three-dimensional package 500 includes a heat sink 510, a first chip package 520, a second chip package 530, and a plurality of solder balls 540, in which the heat sink 510 includes an opening 511 and a first surface 512 and a second surface 513 inside the opening 511. According to the present embodiment, the opening 511 exposes the first surface 512 and the second surface 513 and forms a step shape.

The first chip package 520 includes a first substrate 521, a first chip 522, a plurality of wires 523, and a sealing compound 524, in which the firs substrate 521 includes a top surface 525 and a bottom surface 526. The first chip 522 is disposed on the top surface 525 of the first substrate 521 and electrically connected to the first substrate 521 via the wires 523, in which the sealing compound 524 is utilized to seal the first chip 521 and the wires 523. When the first chip package 520 is bonded to the heat sink 510, the first substrate 521 is positioned on the first surface 512 of the heat sink 510. Additionally, a plurality of external conductive devices 550 is disposed on the bottom surface 526 of the first substrate 521 and exposed from the opening 511 of the heat sink 510 for connecting to other electronic devices (not shown).

The second chip package 530 includes a second substrate 531, a second chip 532, a plurality of wires 533, and a sealing compound 534. The second chip 532 is disposed on a top surface 535 of the second substrate 531, the wires 533 are utilized to electrically connect the second substrate 531 and the second chip 532, and the sealing compound 534 is formed to seal the second chip 532 and the wires 533. When the second chip package 530 is bonded to the heat sink 510, the second substrate 531 is disposed on the second surface 513 of the heat sink 510. Since the first chip package 520 is secured to the first surface 512 of the heat sink 510 and the second chip package 530 is secured to the second surface 513 of the heat sink 510, the present invention is able to accurately align and stack the packages over each other, thereby preventing the warpage phenomenon and utilizing the heat sink effectively. Additionally, by controlling the height of the heat sink 510 corresponding to the height of the solder balls 540 between the first chip package 520 and the second chip package 530, the present invention is able to prevent a solder failure or a broken circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A thermally enhanced three-dimensional package comprising:
   a heat sink having a first opening and a stiffener ring inside the opening, wherein the stiffener ring comprises a first surface and a second surface;
   a first chip package having a first substrate, wherein the first substrate is disposed in the opening of the heat sink and secured to the first surface of the stiffener ring;
   a second chip package having a second substrate, wherein the second substrate is secured to the second surface of the stiffener ring; and
   a plurality of solder balls disposed between the first substrate of the first chip package and the second substrate of the second chip package and inside the stiffener ring for connecting the first substrate and the second substrate.

2. The thermally enhanced three-dimensional package of claim 1, wherein the heat sink comprise an I-shaped cross section.

3. The thermally enhanced three-dimensional package of claim 1, wherein the first chip package comprises a first chip, wherein the first chip is electrically connected to the first substrate.

4. The thermally enhanced three-dimensional package of claim 1 further comprising a plurality of external conductive devices disposed on the first substrate of the first chip package.

5. The thermally enhanced three-dimensional package of claim 1, wherein the second chip package comprises a second chip, wherein the second chip is electrically connected to the second substrate.

6. The thermally enhanced three-dimensional package of claim 1 further comprising at least an adhesive on the first surface and the second surface of the stiffener ring for bonding the first chip package and the second chip package.

* * * * *